(12) United States Patent
Aziz et al.

(10) Patent No.: US 7,777,407 B2
(45) Date of Patent: Aug. 17, 2010

(54) ORGANIC LIGHT EMITTING DEVICES COMPRISING A DOPED TRIAZINE ELECTRON TRANSPORT LAYER

(75) Inventors: Hany Aziz, Oakville (CA); Zoran D. Popovic, Mississauga (CA); Jennifer A. Coggan, Cambridge (CA); Nan-Xing Hu, Oakville (CA)

(73) Assignee: LG Display Co., Ltd., Seoul (KR)

( * ) Notice: Subject to any disclaimer, the term of this patent is extended or adjusted under 35 U.S.C. 154(b) by 505 days.

(21) Appl. No.: 11/122,290

(22) Filed: May 4, 2005

(65) Prior Publication Data
US 2006/0251920 A1  Nov. 9, 2006

(51) Int. Cl.
C09K 11/06 (2006.01)
H01L 51/54 (2006.01)
H05B 33/14 (2006.01)

(52) U.S. Cl. .................. 313/504; 313/506; 428/690; 428/917; 257/40; 257/E51.05

(58) Field of Classification Search ............... 428/690, 428/917; 427/58, 66; 313/502–509; 257/40, 257/88–103, E51.001–E51.052; 252/301.16–301.35
See application file for complete search history.

(56) References Cited

U.S. PATENT DOCUMENTS

| | | | |
|---|---|---|---|
| 2,823,905 A | 2/1958 | Brown | |
| 3,172,862 A | 3/1965 | Gurnee et al. | |
| 3,598,644 A | 8/1971 | Goffe et al. | |
| 4,084,966 A | 4/1978 | Haas et al. | |
| 4,287,449 A | 9/1981 | Takeda et al. | |
| 4,356,429 A | 10/1982 | Tang | |
| 4,539,507 A | 9/1985 | VanSlyke et al. | |
| 4,652,794 A | 3/1987 | Waite et al. | |
| 4,665,115 A | 5/1987 | Lundberg et al. | |
| 4,720,432 A | 1/1988 | VanSlyke et al. | |
| 4,769,292 A | 9/1988 | Tang et al. | |
| 4,885,211 A | 12/1989 | Tang et al. | |
| 5,049,780 A | 9/1991 | Dobrowolski et al. | |
| 5,059,861 A | 10/1991 | Littman et al. | |
| 5,141,671 A | 8/1992 | Bryan et al. | |

(Continued)

FOREIGN PATENT DOCUMENTS

EP  0 977 287 A2  2/2000

(Continued)

OTHER PUBLICATIONS

Hyun-Ouk Ha et al., "Improving the efficiency of organic electroluminescent devices by introducing an electron-accepting and thermally stable polymer", Optical Materials, vol. 21 pp. 165-168 (2002).

(Continued)

Primary Examiner—D. Lawrence Tarazano
Assistant Examiner—Brett A Crouse
(74) Attorney, Agent, or Firm—McKenna Long & Aldridge LLP

(57) ABSTRACT

The present invention relates to organic light emitting devices (OLEDs) containing an electron transport layer comprising a triazine. The triazine can be doped with at least one of organic and inorganic materials. A display device comprising the OLEDs is also disclosed.

9 Claims, 1 Drawing Sheet

U.S. PATENT DOCUMENTS

| | | | |
|---|---|---|---|
| 5,150,006 A | 9/1992 | Van Slyke et al. | |
| 5,151,629 A | 9/1992 | VanSlyke | |
| 5,227,252 A | 7/1993 | Murayama et al. | |
| 5,247,190 A | 9/1993 | Friend et al. | |
| 5,276,381 A | 1/1994 | Wakimoto et al. | |
| 5,409,783 A * | 4/1995 | Tang et al. | 428/690 |
| 5,429,884 A | 7/1995 | Namiki et al. | |
| 5,457,565 A | 10/1995 | Namiki et al. | |
| 5,516,577 A | 5/1996 | Matsuura et al. | |
| 5,593,788 A | 1/1997 | Shi et al. | |
| 5,601,903 A | 2/1997 | Fujii et al. | |
| 5,608,287 A | 3/1997 | Hung et al. | |
| 5,703,436 A | 12/1997 | Forrest et al. | |
| 5,707,745 A | 1/1998 | Forrest et al. | |
| 5,719,467 A | 2/1998 | Antoniadis et al. | |
| 5,728,801 A | 3/1998 | Wu et al. | |
| 5,739,635 A | 4/1998 | Wakimoto | |
| 5,776,622 A | 7/1998 | Hung et al. | |
| 5,837,391 A | 11/1998 | Utsugi | |
| 5,846,666 A | 12/1998 | Hu et al. | |
| 5,853,905 A | 12/1998 | So et al. | |
| 5,925,472 A | 7/1999 | Hu et al. | |
| 5,925,980 A | 7/1999 | So et al. | |
| 5,935,720 A | 8/1999 | Chen et al. | |
| 5,935,721 A | 8/1999 | Shi et al. | |
| 5,942,340 A | 8/1999 | Hu et al. | |
| 5,952,115 A | 9/1999 | Hu et al. | |
| 5,955,836 A | 9/1999 | Boerner et al. | |
| 5,972,247 A | 10/1999 | Shi et al. | |
| 6,013,384 A | 1/2000 | Kido et al. | |
| 6,023,073 A | 2/2000 | Strite | |
| 6,028,327 A | 2/2000 | Mizoguchi et al. | |
| 6,057,048 A * | 5/2000 | Hu et al. | 428/690 |
| 6,105,202 A | 8/2000 | Grasso et al. | |
| 6,107,734 A | 8/2000 | Tanaka et al. | |
| 6,130,001 A | 10/2000 | Shi et al. | |
| 6,225,467 B1 | 5/2001 | Esteghamatian et al. | |
| 6,229,012 B1 | 5/2001 | Hu et al. | |
| 6,274,980 B1 | 8/2001 | Burrows et al. | |
| 6,303,250 B1 | 10/2001 | Watanabe et al. | |
| 6,392,250 B1 * | 5/2002 | Aziz et al. | 257/40 |
| 6,392,339 B1 | 5/2002 | Aziz et al. | |
| 6,423,429 B2 | 7/2002 | Kido et al. | |
| 6,437,123 B1 | 8/2002 | Bock et al. | |
| 6,465,115 B2 | 10/2002 | Shi et al. | |
| 6,479,172 B2 | 11/2002 | Hu et al. | |
| 6,562,485 B2 | 5/2003 | Hu et al. | |
| 6,565,996 B2 | 5/2003 | Hatwar et al. | |
| 6,614,175 B2 | 9/2003 | Aziz et al. | |
| 6,717,358 B1 | 4/2004 | Liao et al. | |
| 6,734,625 B2 | 5/2004 | Vong et al. | |
| 6,737,177 B2 | 5/2004 | Aziz et al. | |
| 6,740,429 B2 | 5/2004 | Aziz et al. | |
| 6,750,609 B2 | 6/2004 | Aziz et al. | |
| 6,753,098 B2 | 6/2004 | Aziz et al. | |
| 6,759,146 B2 | 7/2004 | Aziz et al. | |
| 6,765,348 B2 | 7/2004 | Aziz et al. | |
| 6,773,830 B2 | 8/2004 | Aziz et al. | |
| 6,821,643 B1 | 11/2004 | Hu et al. | |
| 6,841,932 B2 | 1/2005 | Aziz et al. | |
| 7,083,490 B2 | 8/2006 | Mueller et al. | |
| 7,211,948 B2 * | 5/2007 | Liao et al. | 313/506 |
| 7,288,887 B2 | 10/2007 | Aziz et al. | |
| 7,291,404 B2 | 11/2007 | Aziz et al. | |
| 7,351,999 B2 | 4/2008 | Li | |
| 2002/0037398 A1 | 3/2002 | Tofuku et al. | |
| 2002/0121860 A1* | 9/2002 | Seo et al. | 313/506 |
| 2002/0135296 A1* | 9/2002 | Aziz et al. | 313/504 |
| 2002/0145380 A1 | 10/2002 | Aziz et al. | |
| 2002/0180349 A1 | 12/2002 | Aziz et al. | |
| 2003/0071565 A1 | 4/2003 | Hatwar et al. | |
| 2003/0116772 A1 | 6/2003 | Yamazaki et al. | |
| 2003/0134146 A1* | 7/2003 | Aziz et al. | 428/690 |
| 2003/0189401 A1 | 10/2003 | Kido et al. | |
| 2003/0230974 A1 | 12/2003 | Chang et al. | |
| 2003/0234609 A1 | 12/2003 | Aziz et al. | |
| 2004/0004433 A1 | 1/2004 | Lamansky et al. | |
| 2004/0009418 A1 | 1/2004 | Main et al. | |
| 2004/0018383 A1* | 1/2004 | Aziz et al. | 428/690 |
| 2004/0027059 A1 | 2/2004 | Tsutsui | |
| 2004/0227460 A1 | 11/2004 | Liao et al. | |
| 2004/0262615 A1 | 12/2004 | Cok | |
| 2005/0064235 A1* | 3/2005 | Liao et al. | 428/690 |
| 2005/0100760 A1* | 5/2005 | Yokoyama | 428/690 |
| 2005/0112400 A1 | 5/2005 | Seo et al. | |
| 2005/0140275 A1 | 6/2005 | Park | |
| 2005/0175857 A1 | 8/2005 | Coggan et al. | |
| 2006/0105202 A1 | 5/2006 | Kitamura | |
| 2006/0139516 A1 | 6/2006 | Park | |
| 2006/0139893 A1 | 6/2006 | Yoshimura et al. | |
| 2006/0194076 A1* | 8/2006 | Nariyuki | 428/690 |
| 2006/0251919 A1* | 11/2006 | Aziz et al. | 428/690 |
| 2006/0251920 A1 | 11/2006 | Aziz et al. | |
| 2006/0261727 A1 | 11/2006 | Aziz et al. | |
| 2006/0261731 A1 | 11/2006 | Aziz et al. | |
| 2006/0263593 A1 | 11/2006 | Aziz et al. | |
| 2006/0263628 A1 | 11/2006 | Aziz et al. | |
| 2006/0263629 A1 | 11/2006 | Aziz et al. | |
| 2006/0265278 A1 | 11/2006 | Dimeo | |

FOREIGN PATENT DOCUMENTS

| | | |
|---|---|---|
| EP | 0 977 288 A2 | 2/2000 |
| EP | 1 009 044 A2 | 6/2000 |
| EP | 1 010 359 B1 | 6/2000 |
| EP | 1 017 118 | 7/2000 |
| EP | 1 029 832 A | 8/2000 |
| EP | 1 160 890 A2 | 12/2001 |
| EP | 1 167 488 | 1/2002 |
| EP | 1311139 | 5/2003 |
| EP | 1 339 112 A | 8/2003 |
| EP | 1 624 503 A2 | 2/2006 |
| EP | 1 624 504 A2 | 2/2006 |
| JP | 04-230997 | 8/1992 |
| JP | 06-176870 | 6/1994 |
| JP | 8-222374 A | 8/1996 |
| JP | 09-188875 | 7/1997 |
| JP | 10-316904 A | 12/1998 |
| JP | 11-312584 | 11/1999 |
| JP | 11-329749 | 11/1999 |
| JP | 2002-055203 A | 2/2002 |
| JP | 2003-045676 | 2/2003 |
| JP | 2003-086381 | 3/2003 |
| JP | 2003-151777 | 5/2003 |
| JP | 2004-039617 | 2/2004 |
| JP | 2004-095546 | 3/2004 |
| JP | 2004-139981 | 5/2004 |
| JP | 2004-317897 A | 11/2004 |
| JP | 2005-070574 | 3/2005 |
| JP | 2005-072012 | 3/2005 |
| JP | 2006-173550 | 6/2006 |
| JP | 2006-210845 | 8/2006 |
| WO | WO 97/33296 | 9/1997 |
| WO | WO 98/41065 | 9/1998 |
| WO | WO 01/06816 A1 | 1/2001 |
| WO | WO 01/08240 A1 | 2/2001 |
| WO | WO 03/055275 | 7/2003 |
| WO | WO 03/088718 A1 | 10/2003 |
| WO | WO/2004/068911 | 8/2004 |
| WO | WO 2005/037954 | 4/2005 |
| WO | WO 2006/033472 A1 | 3/2006 |
| WO | WO 2006/038573 A1 | 4/2006 |

WO WO 2006/076092 A1 7/2006

OTHER PUBLICATIONS

Liu et al., "Development of highly stable organic electroluminescent devices with a doped co-host emitter system", Current Applied Physics 5, pp. 218-221 (2005).

Aziz et al., "Reduced reflectance cathode for organic light-emitting devices using metalorganic mixtures", Applied Physics Letters, vol. 83, No. 1, pp. 186-188 (2003).

Endo et al., "Organic Electroluminescent Devices with a Vacuum-Deposited Lewis-Acid-Doped Hole-Injecting Layer", Japanese Journal of Applied Physics, vol. 41, No. 3B, pp. L358-L360, Mar. 2002.

Day et al., "The use of charge transfer interlayers to control hole injection in molecular organic light emitting diodes", Thin Solid Films, vol. 410, pp. 159-166, May 2002.

Gardin et al., "Light-Absorption Phenomena in Novel Low-Reflectance Cathodes for Organic Light-Emitting Devices Utilizing Metal-Organic Mixtures", Advanced Materials, vol. 15, No. 23, pp. 2021-2024, Dec. 2003.

Welying Gao; Controlled p doping of the hole-transport molecular material N,N'=diphenyl-N,N'-bis(1-naphthyl)-1,1'-biphenyl-4,4'-diamine with Terafluorotetracyanoquinodimethane, Journal of Applied Physics, vol. 94, No. 1 (Jul. 1, 2003), pp. 359-366.

H. Michelle Grandia et al.; Light-Absorption Phenomena in Novel Low-Reflective Cathodes for Organic Light-Emitting Devices Utilizing Metal-Organic Mixtures; Advanced Materials, 2003, 15, No. 23; pp. 2021-2024.

Choong et al.; "Organic Light Emitting Diodes With a Bipolar Transport Layer"; Applied Physics Letters; vol. 75, No. 2, Jul. 12, 1999, pp. 172-174.

Matsumoto, Toshio et al., Multiphoton Emission OLED: Structure and Property, IDW'03; Dec. 2003, pp. 1285-1288.

A. Gyoutoku et al., "An Organic Electroluminescent Dot-Matrix Display Using Carbon Underlayer", Synthetic Metals, vol. 91, pp. 73-75 (1997).

Baldo et al., "Highly efficient phosphorescent emission from organic electroluminescent devices," Letters to Nature, vol. 395, pp. 151-154 (1998).

Bernius et al., "Developmental Progress of Electroluminescent Polymeric Materials and Devices" Proceedings of SPIE Conference on Organic Light Emitting Materials and Devices III, Denver, Colo., vol. 3797, p. 129-137 (Jul. 1999).

Carter et al., *"Polymeric anodes for improved polymer light-emitting diode performance"*, Appl. Phys. Lett. 70 (16); pp. 2067-2069 (Apr. 21, 1997).

Chengfeng Qiu et al., Comparative Study of Metal or Oxide Capped Indium-Tin Oxide Anodes for Organic Light-Emitting Diodes, Journal of Applied Physics, vol. 93, No. 6 pp. 3253-3257 (Mar. 15, 2003).

Chengfeng Qiu et al., "Praseodymium Oxide Coated Anode for Organic Light-Emitting Diode", Applied Physics Letters, vol. 80, No. 19, pp. 3485-3487 (May 13, 2002).

Chieh-Wei Chen et al., "Top-Emitting Organic Light-Emitting Devices Using Surface-Modified Ag Anode," Applied Physics Letters, vol. 83, No. 25, pp. 5127-5129 (Dec. 22, 2003).

Hongjin Jiang et al., "Improvement of Organic Light-Emitting Diodes Performance by the Insertion of a $Si_3N_4$ Layer", Thin Solid Films, vol. 363, pp. 25-28 (2000).

I-Min Chan et al., "Enhanced Hole Injections in Organic Light-Emitting Devices by Depositing Nickel Oxide on Indium Tin Oxide Anode," Applied Physics Letters, vol. 81, No. 10, pp. 1899-1901 (Sep. 2, 2002).

Kido et al., "White-Light-Emitting Organic Electroluminescent Device Using Lanthanide Complexes," Jpn. J. Appl. Phys., vol. 35, pp. L394-L396 (1996).

Kim et al., *"Anode material based on Zr-doped ZnO thin films for organic light-emitting diodes"*, Appl. Phys. Lett., vol. 83, No. 18, pp. 3809-3811 (Nov. 3, 2003).

Kim et al., *"Molecular organic light-emitting diodes using highly conducting polymers as anodes"*, Appl. Phys. Lett., vol. 80 No. 20, pp. 3844-3846 (May 20, 2002).

L.S. Hung et al., "Anode Modification of in Organic Light-Emitting Diodes by Low-Frequency Plasma Polymerization of CHF3", Applied Physics Letters, vol. 78, No. 5, pp. 673-675 (Jan. 29, 2001).

S. A. VanSlyke et al., "Organic Electroluminescent Devices with Improved Stability", Applied Physics Letters, vol. 69, No. 15, pp. 2160-2162 (Oct. 7, 1996).

S. Karg et al., "Increased Brightness and Lifetime of Polymer Light Emitting Diodes with Polyanilne Anodes", Synthetic Metals, vol. 80, pp. 111-117 (1996).

Soo-Jin Chua et al., "Stabilization of Electrode Migration in Polymer Electroluminescent Devices", Applied Physics Letters, vol. 81, No. 6, pp. 1119-1121 (Aug. 5, 2002).

Wenping Hu et al. "Lowering of Operational Voltage of Organic Electroluminescent Devices by Coating Indium Tin Oxide Electrodes with a Thin $CuO_x$ Layer", Applied Physics Letters, vol. 80, No. 15, pp. 2640-2641 (Apr. 15, 2002).

Yulong Shen et al., "Modification of Indium Tin Oxide for Improved Hole Injection in Organic Light Emitting Diodes," Advanced Materials, vol. 13, No. 16 pp. 1234-1238 (Aug. 16, 2001).

Z.B. Deng et al., "Enhanced Brightness and Efficiency in Organic Electroluminescent Devices Using $SiO_2$ Buffer Layers", Applied Physics Letters, vol. 74, No. 15, pp. 2227-2229 (Apr. 12, 1999).

Zugang et al., *"Organic thin film electroluminescent devices with ZnO:A l as the anode"*, J. Phys.: Condens. Matter 8, pp. 3221-3228 (1996).

Blochwitz et al., "Non-polymeric OLEDs with a doped amorphous hole transport layer and operating voltages down to 3.2 V to achieve 100 $cd/m^2$", Synth. Metals 2002, vol. 127, pp. 169-173.

* cited by examiner

ORGANIC LIGHT EMITTING DEVICES COMPRISING A DOPED TRIAZINE ELECTRON TRANSPORT LAYER

FIELD

The present disclosure relates to organic light emitting devices containing a doped triazine electron transport layer.

REFERENCES

Organic light emitting devices (OLEDs) are useful for display applications and, in particular, mobile hand held display applications. In general, an OLED comprises an anode, a cathode, and a luminescent zone between the anode and cathode. The luminescent zone can contain one or more layers and generally comprises at least one electroluminescent material in at least one of those layers. OLEDs have typically been manufactured to include separate layers of a hole transport material and an emitting electron transport material. In many known OLED displays, the hole transport and electron transport layers are doped with organic dyes in order to enhance the efficiency or to improve the stability of the OLED.

A simple OLED may comprise a layer of an organic luminescent material conductively sandwiched between an anode, generally comprised of a transparent conductor, such as indium tin oxide, and a cathode, generally a low work function metal such as magnesium, calcium, aluminum, or the alloys thereof with other metals. The OLED functions on the principle that under an electric field, positive charges (holes) and negative charges (electrons) are respectively injected from the anode and cathode into the luminescent layer and undergo recombination to form excitonic states that subsequently emit light. A number of prior art OLEDs have been prepared from a laminate of an organic luminescent material and electrodes of opposite polarity, which devices include a single crystal material, such as a single crystal anthracene, as the luminescent substance as described, for example, in U.S. Pat. No. 3,530,325. However, such devices may require excessive excitation voltages on the order of 100 volts or greater.

OLEDs can also be formed as a dual layer structure comprising one organic layer adjacent to the anode supporting hole transport, and another organic layer adjacent to the cathode supporting electron transport and acting as the light emitting region in the organic luminescent zone of the device. Another alternate device configuration comprises three separate layers: a hole transport layer, a luminescent layer, and an electron transport layer, which layers are laminated in sequence and are sandwiched between an anode and a cathode. A fluorescent dopant material is optionally added to the emission zone or layer, whereby the recombination of charges results in the excitation of the fluorescent material.

In small-molecule OLEDs, tris(8-hydroxyquinoline) aluminum ($AlQ_3$) is a suitable electron transport material and has been widely used in the electron transport layer of OLEDs. Triazines may be a better alternative to $ALQ_3$ because of their higher electron mobility. The higher electron mobility may lead to substantially lower OLED driving voltages and hence significantly lower power consumption. For example, the use of triazines over $AlQ_3$ in the electron transport layer of an OLED may result in a decrease of driving voltages and power consumption by as much as 30%. The use of triazines as electron transport materials is disclosed in U.S. Pat. Nos. 6,229,012 and 6,225,467 (the disclosures of which are incorporated herein by reference).

While triazines may provide superior electron mobility in OLEDs, they may exhibit relatively low morphological stability compared to other known electron transport materials. The morphological instability may lead to the evolution of non-uniformities and structural defects in an OLED display. Thus, there is a need for an electron transport material that is capable of providing desired electron mobility and that is morphologically stable.

SUMMARY

In accordance with one embodiment, there is provided herein an organic light emitting device comprising (a) a cathode, (b) a luminescent zone, and (c) an anode, wherein the luminescent zone comprises an electron transport layer comprising a triazine doped with at least one of organic and inorganic materials.

According to another embodiment, there is provided a display device comprising at least one organic light emitting device comprising (a) a cathode, (b) a luminescent zone, and (c) an anode, wherein the luminescent zone comprises an electron transport layer comprising a triazine doped with at least one of organic and inorganic materials.

According to yet another embodiment, there is provided an electron transport material comprising a triazine doped with at least one of organic and inorganic materials.

DESCRIPTION OF VARIOUS EMBODIMENTS

The OLEDs disclosed herein comprise a cathode, a luminescent zone, and an anode. The luminescent zone refers to the zone between the anode and the cathode that is capable of providing luminescence. The luminescent zone comprises at least one layer. For example, the luminescent zone comprises two or three layers. The luminescent zone comprises an electroluminescent material, for example an organic electroluminescent material. The organic electroluminescent material can be present in any layer of the luminescent zone. The OLEDs can comprise electron and hole transport materials in the luminescent zone. The electron and hole transport materials may be present in electron and hole transport layers, respectively. The electron and hole transport layers can be within the luminescent zone, or they can be in layers separate from the luminescent zone.

The luminescent zone can comprise an electroluminescent layer and/or an electron transport layer. In accordance with the present disclosure, the luminescent zone comprises a layer comprising a triazine and a dopant. The electroluminescent layer can comprise the doped triazine. In addition, or alternatively, the electron transport layer can comprise the doped triazine.

A "dopant" refers to a component in a mixture. For example, a material in a mixture can be considered a dopant when the material does not comprise the majority of the mixture. According to one embodiment, a dopant is typically present in a mixture in an amount less than 50% by volume, relative to the total volume of the mixture. According to another embodiment, a dopant is typically present in an amount less than about 20% by volume, relative to the total volume of the mixture.

Figure 1:
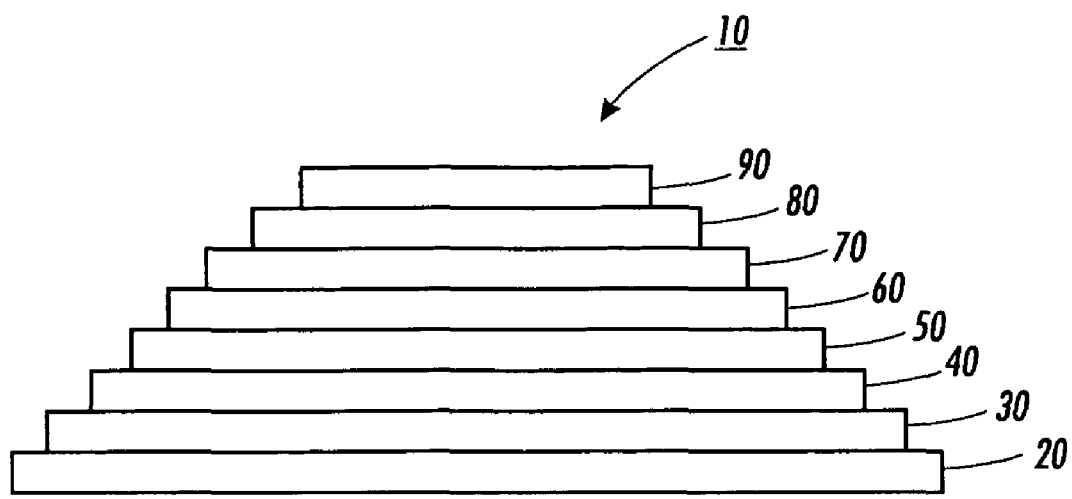
FIG. 1 illustrates an organic light emitting device in accordance with the present disclosure.
Figure 2:
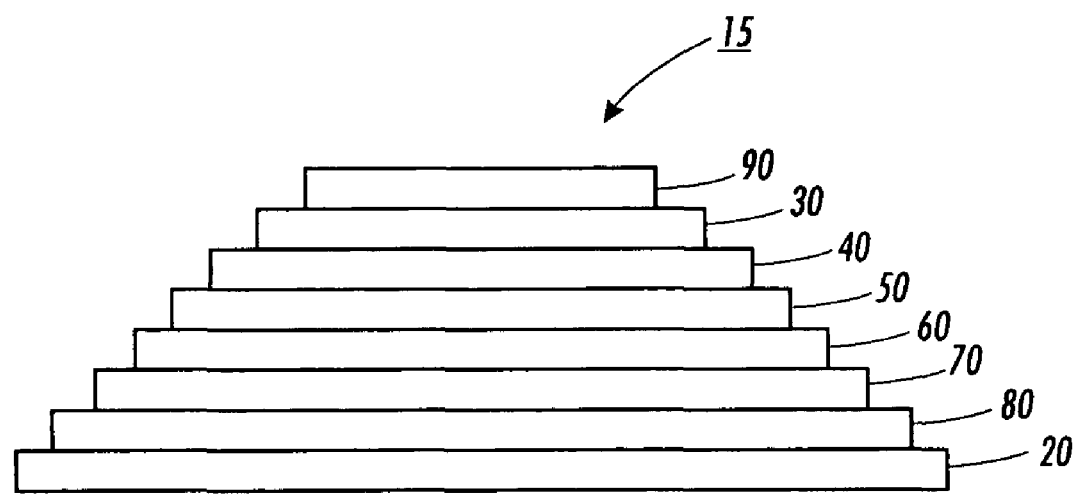
FIG. 2 illustrates another organic light emitting device in accordance with the present disclosure.

In one embodiment, and with reference to FIG. 1, an OLED 10 comprises in sequence a supporting substrate 20 of, for example, glass; an anode 30 of, for example, indium tin oxide in a thickness of from about 1 to about 500 nm, such as from about 30 to about 100 nm; an optional buffer layer 40 of, e.g., copper phthalocyanine, or plasma polymerized $CHF_3$ in a thickness from about 1 nm to about 300 nm; an optional hole transporting layer 50 of, for example, N,N'-di(naphthalene-1-yl)-N,N'-diphenyl-benzidine) (NPB) in a thickness of from about 1 to about 200 nm, for example from about 5 to about 100 nm; an electroluminescent layer 60 comprised of, for example, a composition comprising $AlQ_3$, with the layer having a thickness of from about 5 to about 300 nm, such as from about 10 to about 100 nm; an electron transporting layer 70 comprised of, for example, 4,4'-bis[2-(4,6-diphenyl-1,3,5-triazinyl)]-1,1'-biphenyl (T1) doped with $AlQ_3$ in a thickness of from about 5 to about 300 nm, for example from about 1 to about 200 nm, such as about 5 nm to about 100 nm; and in contact therewith a low work function metal cathode 80. An optional protective layer 90 may be formed on the cathode 80. According to another embodiment, and as illustrated in FIG. 2, in OLED 15 the supporting substrate 20 is adjacent to cathode 80, and optional protective layer 90 is adjacent to anode 30.

In various embodiments, OLEDs can comprise a supporting substrate 20. Illustrative examples of supporting substrates 20 include glass and the like, and polymeric components including polyesters like MYLAR®, polycarbonates, polyacrylates, polymethacrylates, polysulfones, quartz, and the like. Other substrates 20 may also be selected provided they can effectively support the other layers and do not interfere with the device functional performance. The thickness of substrate 20 can range, for example, from about 25 to about 1,000 μm or more, for example from about 50 to about 500 μm depending, for example, on the structural demands of the device.

According to various embodiments, the OLEDs can contain an anode 30, which may be contiguous to the substrate. Suitable non-limiting examples of anode 30 include positive charge injecting electrodes such as indium tin oxide, tin oxide, gold, platinum, or other suitable materials such as electrically conductive carbon, π-conjugated polymers such as polyaniline, polypyrrole, and the like with, for example, a work function equal to, or greater than about 4 eV (electron volts), and more specifically, from about 4 eV to about 6 eV. The thickness of the anode can range from about 1 to about 500 nm, with the suitable range being selected in view of the optical constants of the anode material. One suitable range of anode thickness is from about 30 to about 100 nm. Additional suitable forms of the anode are illustrated in U.S. Pat. No. 4,885,211 (the disclosure of which is incorporated herein by reference).

A buffer layer 40 can optionally be provided contiguous to the anode. The buffer layer, which can function to facilitate efficient injection of holes from the anode and to improve the adhesion between the anode and the hole transporting layer (thus further improving the device operation stability) includes conductive materials such as polyaniline and its acid-doped forms, polypyrrole, poly(phenylene vinylene), and known semiconductive organic materials; porphyrin derivatives disclosed in U.S. Pat. No. 4,356,429 (the disclosure of which is incorporated herein by reference), such as 1,10,15,20-tetraphenyl-21H,23H-porphyrin copper (II); copper phthalocyanine, copper tetramethyl phthalocyanine; zinc phthalocyanine; titanium oxide phthalocyanine; magnesium phthalocyanine; and the like. The buffer layer can comprise a tertiary amine suitable as an electron hole transport material.

The buffer layer can be prepared by forming one of the above compounds into a thin film by known methods, such as vapor deposition or spin coating. The thickness of the buffer layer thus formed is not particularly limited, and can range of from about 5 nm to about 300 nm, for example from about 10 nm to about 100 nm.

In various embodiments, OLED 10 comprises an optional hole transport layer 50 comprising a hole transport material. Suitable non-limiting examples of hole transport materials include tertiary aromatic amines, like NPB; N,N'-diphenyl-N,N'-bis(3-methylphenyl)-1,1-biphenyl-4,4'-diamine) (TPD); N,N'-bis(p-phenyl)-N,N'-diphenyl benzidene (BP-TPD), and the aromatic tertiary amines disclosed in U.S. Pat. No. 4,539,507, the disclosure of which is incorporated herein by reference. Examples of suitable aromatic tertiary amines include bis(4-dimethylamino-2-methylphenyl)phenylmethane; N,N, N-tri(p-tolyl)amine; 1,1-bis(4-di-p-tolylaminophenyl)cyclohexane; 1,1-bis(4-di-p-tolylaminophenyl)-4-phenyl cyclohexane; N,N'-diphenyl-N,N'-bis(3-methylphenyl)-1,1'-biphenyl-4,4'-diamine; N,N'-diphenyl-N,N'-bis(3-methylphenyl)-1,1'-biphenyl-4,4'-diamine; N,N'-diphenyl-N,N'-bis(4-methoxyphenyl)-1,1'-biphenyl-4,4'-diamine; N,N,N',N'-tetra-p-tolyl-1,1'-biphenyl-4,4'-diamine; N,N'-di-1-naphthyl-N,N'-diphenyl-1,1'-biphenyl-4,4'-diamine; and the like.

Another class of aromatic tertiary amines suitable as hole transporting materials is the polynuclear aromatic amines, such as N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; and N,N-bis-[4'-(N-phenyl-N-m-tolylamino)-4-biphenylyl]-1-aminonaphthalene, and the like.

Additional suitable hole transport materials include carbazoles like N,N'-dicarbazolyl-4,4'-biphenyl (CBP), 4,4'-bis(3, 6-diphenylcarbazol-9-yl)-1,1'-biphenyl (TPCB), and 4,4'-bis (9-carbazolyl)-1,1'-biphenyl compounds. Illustrative examples of 4,4'-bis(9-carbazolyl)-1,1'-biphenyl compounds include 4,4'-bis(9-carbazolyl)-1,1'-biphenyl and 4,4'-bis(3-methyl-9-carbazolyl)-1,1'-biphenyl, and the like. Another class of suitable hole transport materials is the indocarbazoles, including 5,11-di-naphthyl-5,11-dihydroindolo[3,2-b] carbazole (NIC).

OLED 10 comprises an electroluminescent layer 60 comprising an electroluminescent material. Suitable electroluminescent materials include, for example, polyphenylenevinylenes such as poly(p-phenylenevinylene) (PPV), poly(2-methoxy-5-(2-ethylhexyloxy)1,4-phenylenevinylene) (MEHPPV), poly(2,5-dialkoxyphenylenevinylene) (PD-MeOPV), and other materials disclosed in U.S. Pat. No. 5,247,190 (the disclosure of which is incorporated herein by reference); polyphenylenes, such as poly(p-phenylene) (PPP), ladder-poly-para-phenylene (LPPP), and poly(tetrahydropyrene) (PTHP); and polyfluorenes, such as poly(9, 9-di-n-octylfluorene-2,7-diyl), poly(2,8-(6,7,12,12-tetraalkylindenofluorene), and copolymers containing fluorenes such as fluorene-amine copolymers (see e.g., Bernius et al., "Developmental Progress of Electroluminescent Polymeric Materials and Devices," Proceedings of SPIE Conference on Organic Light Emitting Materials and Devices III, Denver, Colo., July 1999, Volume 3797, p. 129).

Another class of electroluminescent materials suitable for the electroluminescent layer includes the metal oxinoid compounds as disclosed in U.S. Pat. Nos. 4,539,507; 5,151,629; 5,150,006; 5,141,671 and 5,846,666, (the disclosures of which are all incorporated herein by reference). Illustrative examples include $AlQ_3$ and bis(8-hydroxyquinolato)-(4-phenylphenolato) aluminum (BAlq). Other examples of this class of materials include tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxybenzo[h]quinolinate) beryllium, and the like, and metal thioxinoid compounds disclosed in U.S. Pat. No. 5,846,666 (which is incorporated herein by reference), such as metal thioxinoid compounds of bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Suitable materials include bis(8-quinolinethiolato)zinc, bis(8-quinolinethiolato)cadmium, tris(8-quinolinethiolato)gallium, tris(8-quinolinethiolato)indium and bis[benzo{f}-8-quinolinethiolato]zinc.

Another class of electroluminescent materials that can be used in the electroluminescent layer comprises stilbene derivatives, such as those disclosed in U.S. Pat. No. 5,516,577 (the disclosure of which is incorporated herein by reference). One suitable stilbene derivative is 4,4'-bis(2,2-diphenylvinyl) biphenyl. Another class of electroluminescent materials that can be used in the electroluminescent layer comprises anthracene derivatives such as, for example N,N'-di(naphthalene-1-yl)-N,N'-diphenyl-benzidine), 2-t-butyl-9,10-di-(2-naphthyl) anthracene, 2-(1,1-dimethylethyl)-9,10-bis(2-naphthalenyl)anthracene (TBADN), 9,10-di-(2-naphthyl) anthracene (DNA), 9,10-di-phenyl anthracene (DPA), 9-bis(phenyl)anthracene (BPA), 2-t-butyl-9,10-di-(2-naphthyl) anthracene, 9,10-di-(2-naphthyl)anthracene, 9,10-di-phenyl anthracene, 9,9-bis[4-(9-anthryl)phenyl]fluorene, and 9,9-bis[4-(10-phenyl-9-anthryl)phenyl]fluorene. Other suitable anthracenes are disclosed in U.S. Pat. No. 6,465,115 (corresponding to EP 1009044 A2), U.S. Pat. No. 5,972,247, U.S. Pat. No. 6,479,172, and U.S. Pat. No. 5,935,721, the disclosures of which are incorporated herein by reference.

Still another class of suitable electroluminescent materials suitable for use in the electroluminescent layer is the oxadiazole metal chelates. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato] beryllium; bis[5-(4-chlorophenyl)-2-(2-hydroxyphenyl)-1,3,4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato] zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato] beryllium, and the like; and the triazines including those disclosed in U.S. Pat. No. 6,057,048 (the disclosure of which is incorporated herein by reference in its entirety).

The electroluminescent layer can further include a dopant in an amount ranging from about 0.01 weight percent to about 49 weight percent, for example from about 1 weight percent to about 20 weight percent. The dopant can be an electroluminescent material. Examples of dopant materials that can be used in the electroluminescent layer include fluorescent materials, such as coumarin, dicyanomethylene pyranes, polymethine, oxabenzanthrane, xanthene, pyrylium, carbostyl, perylene, and the like. Another suitable class of fluorescent materials is quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like as disclosed in U.S. Pat. Nos. 5,227,252; 5,276,381 and 5,593,788 (each of which is incorporated herein by reference in its entirety).

Another class of fluorescent materials that can be used as dopants is the fused ring fluorescent dyes. Exemplary suitable fused ring fluorescent dyes include perylene, rubrene, anthracene, coronene, phenanthrecene, pyrene and the like, as disclosed in U.S. Pat. No. 3,172,862 (the disclosure of which is incorporated herein by reference in its entirety). Additional fluorescent materials include butadienes, such as 1,4-diphenylbutadiene and tetraphenylbutadiene, and stilbenes, and the like, as disclosed in U.S. Pat. Nos. 4,356,429 and 5,516,577 (each of which is incorporated herein by reference). Other examples of fluorescent materials that can be used are those disclosed in U.S. Pat. No. 5,601,903 (the disclosure of which is incorporated herein by reference in its entirety).

In order to achieve a low driving voltage, the thickness of the electroluminescent layer can be from about 5 nm to about 50 nm. According to one embodiment, the thickness ranges from about 10 nm to about 40 nm. According to another embodiment, the thickness ranges from about 15 nm to about 30 nm. According to another embodiment, the thickness ranges from about 40 nm to about 20 nm. According to still another embodiment, the thickness of the electroluminescent layer is less than about 20 nm.

According to various embodiments, electroluminescent material layer 60 can comprise at least two materials having different electron and hole transport capacities and can have a thickness of less than about 50 nm, as described in U.S. patent application Ser. No. 11/122,288, filed on even date herewith (the disclosure of which is incorporated by reference herein).

In various embodiments, the OLEDs disclosed herein contain an electron transport layer 70 comprising a triazine doped with at least one of organic and inorganic materials. There are a number of triazines suitable for forming electron transport layer 70. Suitable triazines include those disclosed in U.S. Pat. Nos. 6,225,467 and 6,229,012 (the disclosures of which are incorporated by reference herein). Non-limiting examples of suitable triazines include 4,4'-bis[2-(4,6-diphenyl-1,3,5-triazinyl)]-1,1'-biphenyl (T1); 2,4,6-tris(4-biphenylyl)-1,3,5-triazine; 2,4,6-tris[4-(4'-methylbiphenylyl)]-1,3,5-triazine; 2,4,6-tris[4-(4'-tert-butylbiphenylyl)-1,3,5-triazine; 2,4,6-tris[4-(3',4'-dimethylbiphenylyl)]-1,3,5-triazine; 2,4,6-tris[4-(4'-methoxybiphenylyl)]-1,3,5-triazine; 2,4,6-tris[4-(3'-methoxybiphenylyl)]-1,3,5-triazine; 2,4-bis(4-biphenylyl)-6-phenyl-1,3,5-triazine; 2,4-bis(4-biphenylyl)-6-m-tolyl-1,3,5-triazine; 4,4'-bis-[2-(4,6-diphenyl-1,3,5-triazinyl)]-1,1'-biphenyl; 4,4'-bis-[2-(4,6-di-p-tolyl-1,3,5-triazinyl)]-1,1'-biphenyl; 4,4'-bis-[2-(4,6-di-m-tolyl-1,3,5-triazinyl)]-1,1'-biphenyl; 4,4'-bis-[2-(4,6-di-p-methoxyphenyl-1,3,5-triazinyl)]-1,1'-biphenyl; 4,4'-bis-[2-(4,6-di-m-methoxyphenyl-1,3,5-triazinyl)]-1,1'-biphenyl; 4,4'-bis-[2-(4-β-naphthyl-6-phenyl-1,3,5-triazinyl)]-1,1'-biphenyl; 4,4'-bis-[2 (4,6-di-biphenylyl-1,3,5-triazinyl)]-1,1'-biphenyl; 4-[2-(4,6-diphenyl-1,3,5-triazinyl)]-4'-[2-(4,6-di-m-tolyl-1,3,5-triazinyl)]-1,1'-biphenyl; 2,7-bis-[2-(4,6-di-phenyl-1,3,5-triazinyl)]fluorine; 2,7-bis-[2-(4,6-di-phenyl-1,3,5-triazinyl)]-9,9-dimethylfluorene; 2,7-bis-[2-(4,6-di-phenyl-1,3,5-triazinyl)]-9,9-diethylfluorene; 2,7-bis-[2-(4,6-diphenyl-1,3,5-triazinyl)]-9,9-diphenylfluorene; 2,7-bis-[2-(4,6-diphenyl-1,3,5-triazinyl)]-9,10-dihydraphenanthrene; 4,9-bis-[2-(4,6-di-phenyl-1,3,5-triazinyl)]dibenzofuran; 4,9-bis-[2-(4,6-di-phenyl-1,3,5-triazinyl)]dibenzothiophene; 2,7-bis-[2-(4,6-di-phenyl-1,3,5-triazinyl)]-9,9-dimethyl-9-silafluorene; and the like.

The electron transport layer can be composed entirely of the doped triazine, or it can include the doped triazine in combination with other materials, for example other electron transport materials such as stilbene derivatives, such as those disclosed in U.S. Pat. No. 5,516,577, which is incorporated herein by reference. A suitable stilbene derivative is 4,4'-bis (2,2-diphenylvinyl)biphenyl. Yet another class of suitable electron transport materials that can be combined with the doped triazine is the metal thioxinoid compounds, illustrated in U.S. Pat. No. 5,846,666 (the disclosure of which is incorporated herein by reference). In certain embodiments, the electron transport layer 70 comprises the triazine in an amount of at least 50% by volume.

In various embodiments, the triazine is doped with at least one material. The presence of the dopant material can significantly improve the morphological stability of the triazine electron transport layer and significantly reduce, if not prevent, the evolution of structural defects in the layer over the service life of the OLED display. The dopant can be selected from a wide variety of materials, such as organic and inorganic materials. For example, the dopant can be selected from organic electron transport materials such as metal oxinoids and stilbenes, examples of which have been given above, organic hole transport materials such as tertiary aromatic amines, carbazoles, indolocarbazoles, and bicarbazoles, examples of which have been given above, and organic bipolar transport materials such as anthracenes, fused ring organic dyes, and hydrocarbon materials, examples of which have been given above. The concentration of the dopant can be about 49% or less, relative to the volume of the electron transport layer. According to another embodiment, the dopant can be present in an amount of about 25% or less. According to yet another embodiment, the dopant is present in an amount of less than about 20%, for example less than about 10%.

Electron and hole transport materials suitable as dopants include those identified herein as being useful in the optional hole transport layer 50 and the electroluminescent layer 60. For example, suitable organic dopants include $AlQ_3$, NPB, anthracenes such as BH2, and hydrocarbons such as perylenes and rubrene. Suitable bipolar transport materials useful as dopants include, for example, 2-(1,1-dimethyl-ethyl)-9,10-bis(2-naphthalenyl)anthracenes, 9,10-di-(2-naphthyl) anthracene (DNA), 9,10-di-phenyl anthracene (DPA), 9-bis(phenyl) anthracene (BPA), spiro-BPA, spiro-DPA, perylenes like 2,5,8,11-tetra-t-butylperylene (BD2), tetracenes like rubrene, and other hydrocarbon materials in general. Suitable organic dopants include those dopants disclosed herein than contain carbon. Suitable inorganic dopants include SiO, $SiO_2$, and metals such as, for example, Li, Cs, K, Na, Mg, Ca, and Sc, and compounds containing any of the foregoing such as, for example, LiF. The dopant can also be selected from the electroluminescent materials identified herein as being suitable for the electroluminescent layer 60.

In various embodiments, the OLEDs include a cathode 80. The cathode 80 can comprise any suitable material such as a metal. The material can have a high work function component, for example an eV of from about 4.0 eV to about 6.0 eV. The cathode can comprise a low work function component, such as metals with, for example, an eV of from about 2.5 eV to about 4.0 eV. The cathode can be derived from a combination of a low work function metal (about 4 eV, for example from about 2 eV to about 4 eV) and at least one other metal. Effective proportions of the low work function metal to the second or additional metal are from less than about 0.1 percent to about 99.9 percent by weight. Illustrative examples of low work function metals include alkaline metals such as lithium or sodium, Group 2A or alkaline earth metals such as beryllium, magnesium, calcium, or barium, and Group III metals including rare earth metals and the actinide group metals such as scandium, yttrium, lanthanum, cerium, europium, terbium, or actinium. Lithium, magnesium and calcium are suitable low work function metals.

The thickness of cathode 80 can range from, for example, about 10 nm to about 500 nm. The Mg:Ag cathodes of U.S. Pat. No. 4,885,211 (the disclosure of which is incorporated herein by reference), constitute one suitable cathode construction. Another suitable cathode is described in U.S. Pat. No. 5,429,884 (the disclosure of which is totally incorporated herein by reference), wherein the cathode is formed from lithium alloys with other high work function metals such as aluminum and indium.

The OLEDs disclosed herein can be constructed by conventional methods. In various embodiments, a supporting substrate 20, such as glass, is provided. An anode 30 can be disposed over the glass and can be comprised of, for example, indium tin oxide in a thickness of from about 1 to about 500 nm, for example from about 30 to about 100 nm (throughout the disclosure, thickness ranges for each layer are provided as examples—other suitable thickness can be selected). A buffer layer 40 in contact with the anode can optionally be provided, and can be comprised of a conductive component or hole transport materials having a thickness of from about 5 to about 500 nm, for example from about 10 to about 100 nm. An optional organic hole transporting layer 50 can be disposed over the anode 30 or the buffer layer 40 and in a thickness of from about 1 to about 200, for example from about 5 to about 100 nm. An electroluminescent layer 60 can be provided in contact with the hole transporting layer 50. An electron transport layer 70 can be provided in contact with the electroluminescent layer 60 in a thickness of from about 5 to about 300 nm, such as from about 1 to about 200 nm, for example from about 5 to about 100 nm. A cathode 80 comprising, e.g., a low work function metal can be in contact with the electron transporting layer 70.

According to the present disclosure, embodiments of the OLEDs disclosed herein can be operated under alternating current (AC) and/or direct current (DC) driving conditions. In some cases, AC driving conditions can be suitable to provide extended operational lifetimes, especially in high temperature device operating conditions. Suitable operating voltages are externally-applied driving voltages required to drive sufficient current to obtain a luminance of at least about 100 $cd/m^2$, and typically a luminance of at least about 500 $cd/m^2$, such as, for example a luminance of about 1000 $cd/m^2$. Such voltages can range, for example, from about 0.5 volts to about 20 volts, such as from about 1 volt to about 15 volts. According to various embodiments, the operating voltage is less than about 6 volts, for example less than about 5.5 volts. Suitable driving currents range, for example, from about 1 to about 1000 $mA/cm^2$, such as from about 10 $mA/cm^2$ to about 200 $mA/cm^2$, for example about 25 $mA/cm^2$. Driving voltages and currents outside these ranges can also be used.

The doped triazine materials disclosed herein can be suitable as electron transport materials in small molecule OLEDs, polymeric OLEDs, and hybrid devices (comprising a mixture of small-molecule and polymeric materials). Because of their superior electron transport properties and morphological stability, they can also find applications in other organic electronic devices where efficient electron transport properties are desired such as in photoreceptors, thin film transistors, solar cells, sensors, etc.

EXAMPLES

The following examples are illustrative and are non-limiting to the present teachings.

A group of green-emitting OLEDs was fabricated using physical vapor deposition. All devices comprised an indium tin oxide anode coated on a glass substrate and a Mg:Ag cathode. All devices had a three-layer light emitting region between the anode and the cathode comprising (1) a 60 nm NPB hole transport layer, (2) a 15 nm electroluminescent layer comprising $AlQ_3$+0.8% 10-2-(benzothiazolyl)-2,3,6,7-tetrahydro-1,1,7,7-tetramethyl-1H, 5H, 11H-(1)benzopyropyrano (6,7,8-ij) quinolizin-11-one (C545T), and (3) a 45 nm electron transport layer. Following fabrication, the devices were operated at a constant current of 25 $mA/cm^2$. The driving voltage and brightness of each of the devices at this current were measured and recorded, as were the results of a visual inspection conducted immediately after device fabrication ($t_0$), and again 50 hours ($t_{50}$) later.

Comparative device 1 operated at a high driving voltage. Comparative device 2 operated at a low driving voltage, but exhibited low morphological stability evidenced by the loss of a uniform appearance after 50 hours. Inventive devices 3-5, on the other hand, operated at a driving voltage of 5.1 V or less and exhibited a satisfactory morphological stability as evidenced by a uniform appearance after 50 hours.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "a dopant" includes two or more dopants. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. An organic light emitting device comprising:
   (a) a cathode;
   (b) an anode; and
   (c) a luminescent zone comprising an electron transport layer adjacent the cathode, a hole transport layer adjacent the anode, and an electroluminescent layer between the electron transport layer and the hole transport layer, wherein the electron transport layer comprises a triazine doped with organic and inorganic materials,
   wherein the organic material is N,N'-di(naphthalene-1-yl)-N,N'-diphenyl-benzidine, and
   wherein the inorganic material comprises at least one of SiO, $SiO_2$, and Sc.

| Device No. | ETL Composition | Driving voltage (volts) at 25 $mA/cm^2$ | Brightness ($cd/m^2$) at 25 $mA/cm^2$ | Device Appearance at $t_{(0)}$ | Device Appearance at $t_{(50)}$ |
|---|---|---|---|---|---|
| 1 (comp.) | $AlQ_3$ | 7.15 | 2000 | Uniform | Uniform |
| 2 (comp.) | T1 | 4.45 | 2230 | Uniform | Non-Uniform |
| 3 (inventive) | T1 + 5% $AlQ_3$ | 4.41 | 2150 | Uniform | Uniform |
| 4 (inventive) | T1 + 20% $AlQ_3$ | 4.65 | 2180 | Uniform | Uniform |
| 5 (inventive) | T1 + 50% $AlQ_3$ | 5.1 | 2170 | Uniform | Uniform |

2. The device according to claim 1, further comprising a hole transport material.

3. The device according to claim 2, wherein the hole transport layer comprises the hole transport material.

4. The device according to claim 1, wherein said triazine is 4,4'-bis[2-(4,6-diphenyl-1,3,5-triazinyl)]-1,1'-biphenyl.

5. The device according to claim 1, wherein said dopant is present in an amount less than about 49% by volume, relative to the total volume of the electron transport layer.

6. The device according to claim 1, wherein said dopant is present in an amount less than about 10% by volume, relative to the total volume of the electron transport layer.

7. A display comprising at least one organic light emitting device comprising:
(a) a cathode;
(b) an anode; and
(c) a luminescent zone comprising an electron transport layer adjacent the cathode, a hole transport layer adjacent the anode, and an electroluminescent layer between the electron transport layer and the hole transport layer,
wherein the electron transport layer comprises a triazine doped with organic and inorganic materials,
wherein the organic material is N,N'-di(naphthalene-1-yl)-N,N'-diphenyl-benzidine, and
wherein the inorganic material comprises at least one of SiO, $SiO_2$, and Sc.

8. The display according to claim 7, wherein said organic light emitting device further comprises a hole transport material.

9. An electron transport layer in a luminescent zone comprising a triazine doped with organic and inorganic materials,
wherein the organic material is N,N'-di(naphthalene-1-yl)-N,N'-diphenyl-benzidine, and
wherein the inorganic material comprises at least one of SiO, $SiO_2$, and Sc.

* * * * *